United States Patent
Johnson et al.

(10) Patent No.: US 7,989,302 B2
(45) Date of Patent: Aug. 2, 2011

(54) METHODS OF FORMING A HYPER-ABRUPT P-N JUNCTION AND DESIGN STRUCTURES FOR AN INTEGRATED CIRCUIT

(75) Inventors: Jeffrey B. Johnson, Essex Junction, VT (US); Alvin J. Joseph, Williston, VT (US); Robert M. Rassel, Colchester, VT (US); Yun Shi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/795,108

(22) Filed: Jun. 7, 2010

(65) Prior Publication Data

US 2010/0248432 A1  Sep. 30, 2010

Related U.S. Application Data

(62) Division of application No. 12/099,316, filed on Apr. 8, 2008, now Pat. No. 7,804,119.

(51) Int. Cl.
*H01L 21/20* (2006.01)
(52) U.S. Cl. ........ 438/379; 438/231; 257/312; 257/596; 257/599; 257/E29.344; 257/E21.364; 716/103
(58) Field of Classification Search .......... 438/379, 438/231; 257/312, 596, 599, E29.344, E21.364; 716/12
See application file for complete search history.

(56) References Cited

U.S. PATENT DOCUMENTS

| | | | |
|---|---|---|---|
| 5,610,790 | A | 3/1997 | Staab et al. |
| 5,828,101 | A | 10/1998 | Endo |
| 7,235,439 | B2 | 6/2007 | Udrea et al. |
| 2002/0028541 | A1 | 3/2002 | Lee et al. |
| 2003/0122128 | A1 | 7/2003 | Coolbaugh et al. |
| 2003/0137796 | A1 | 7/2003 | Bulucea |
| 2004/0032004 | A1 | 2/2004 | Coolbaugh et al. |
| 2004/0082124 | A1 | 4/2004 | Coolbaugh et al. |
| 2005/0245038 | A1 | 11/2005 | Coolbaugh et al. |
| 2006/0043454 | A1 | 3/2006 | Coolbaugh et al. |
| 2006/0109607 | A1 | 5/2006 | Arnborg |
| 2006/0145300 | A1 | 7/2006 | Coolbaugh et al. |
| 2007/0105354 | A1 | 5/2007 | Coolbaugh et al. |
| 2007/0158678 | A1 | 7/2007 | Udrea |
| 2007/0200161 | A1 | 8/2007 | Nowak |

OTHER PUBLICATIONS

Ho, Tu Tu V., Examiner, USPTO, Notice of Allowance issued in related U.S. Appl. No. 12/099,316 dated May 24, 2010.
Ho, Tu Tu V., Examiner, USPTO, Office Action issued in related U.S. Appl. No. 12/099,316 dated Feb. 25, 2010.

*Primary Examiner* — Tu-Tu V Ho
(74) *Attorney, Agent, or Firm* — Wood, Herron & Evans LLP

(57) ABSTRACT

Methods of forming hyper-abrupt p-n junctions and design structures for an integrated circuit containing devices structures with hyper-abrupt p-n junctions. The hyper-abrupt p-n junction is defined in a SOI substrate by implanting a portion of a device layer to have one conductivity type and then implanting a portion of this doped region to have an opposite conductivity type. The counterdoping defines the hyper-abrupt p-n junction. A gate structure carried on a top surface of the device layer operates as a hard mask during the ion implantations to assist in defining a lateral boundary for the hyper-abrupt p-n junction.

11 Claims, 13 Drawing Sheets

METHODS OF FORMING A HYPER-ABRUPT P-N JUNCTION AND DESIGN STRUCTURES FOR AN INTEGRATED CIRCUIT

CROSS-REFERENCE TO RELATED APPLICATIONS

This application is a divisional of application Ser. No. 12/099,316, filed Apr. 8, 2008, which is hereby incorporated by reference herein in its entirety.

BACKGROUND

The invention relates generally to semiconductor device fabrication and, in particular, to device structures for a varactor diode, methods of forming device structures for a varactor diode, and design structures for an integrated circuit containing device structures for a varactor diode.

A voltage-controlled varactor diode is a variable capacitor device having the form of a p-n junction diode and designed to take advantage of the variation of capacitance. Varactor diodes are found in many complementary metal-oxide-semiconductor (CMOS) integrated circuits in circuit designs for certain applications, such as radiofrequency (RF) communications and RF wireless applications. Varactor diodes are particularly useful as active elements in parametric circuits, such as oscillation circuits like voltage-controlled oscillators, in which the capacitance tunability of the varactor diode is advantageously used to tune the circuit's oscillation frequency.

Devices fabricated using silicon-on-insulator (SOI) technologies provide certain performance improvements, such as lower parasitic junction capacitance, increased latchup resistance, and reduced power consumption at equivalent performance, in comparison with comparable devices built directly in a bulk silicon substrate. Generally, an SOI substrate includes a thin SOI layer of semiconductor material (e.g., single crystal silicon) partitioned by isolation regions to define discrete electrically-isolated regions for building device structures and a thin buried layer of an insulator, such as a buried oxide ($SiO_2$) layer, physically separating and electrically isolating the SOI layer from a handle wafer. To remedy floating body problems suffered by SOI technologies, methods are being sought to effectively thin the SOI layer to a thickness that provides full depletion of the channel region for field effect transistors under typical gate electrode voltages.

Vertical junction diodes are typically implemented in bulk CMOS technologies. However, diodes with vertical junction architectures are incompatible with advancing SOI technologies because of the scaling of the SOI layer to progressively narrower thicknesses and contact between shallow trench isolation regions and the buried insulating layer of the SOI substrate. This design deficiency prevents the use of the standard cathode contact strategies applicable in bulk CMOS technologies for use in fabricating varactor diodes in SOI technologies. Therefore, this design deficiency prevents the implementation of vertical diode structures in advanced SOI technologies as the SOI layer becomes thinner.

While conventional vertical device structures for varactor diodes have been effective for bulk technologies, advanced device structures for varactor diodes are needed for compatibility with SOI technologies, as well as fabrication methods for these device structures and design structures for integrated circuits including these device structures.

BRIEF SUMMARY

In accordance with an embodiment of the invention, a device structure includes a gate structure on a top surface of a device layer of an SOI substrate, a first electrode of a first conductivity type in the device layer, and a second electrode of a second conductivity type in the device layer. The gate structure includes a gate conductor layer with a first sidewall and a gate dielectric layer between the gate conductor layer and a top surface of the device layer. The second electrode includes a first doped region of the second conductivity type that is disposed in the device layer in a surrounding relationship about the first electrode. The first doped region of the second electrode defines a p-n junction along a boundary shared with the first electrode. The p-n junction includes a vertical segment that is aligned substantially parallel to the top surface of the device layer, as well as a lateral segment that extends from the vertical segment toward the top surface of the device layer.

In another embodiment, the device structure may be included in a design structure embodied in a machine readable medium for designing, manufacturing, or testing an integrated circuit. The design structure may comprise a netlist. The design structure may also reside on storage medium as a data format used for the exchange of layout data of integrated circuits. The design structure may resides in a programmable gate array.

In yet another embodiment, a method is provided for fabricating a device structure in a device layer of an SOI substrate. The method includes forming a gate structure carried on a top surface of the device layer and doping the device layer using at least one sidewall of the gate electrode as a mask to define a first doped region adjacent to the gate structure. The method further includes forming a p-n junction in the doped region such that a first segment of the p-n junction is aligned substantially parallel to the top surface of the device layer and a second segment of the p-n junction extends from the first segment toward the top surface of the device layer.

BRIEF DESCRIPTION OF THE SEVERAL VIEWS OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
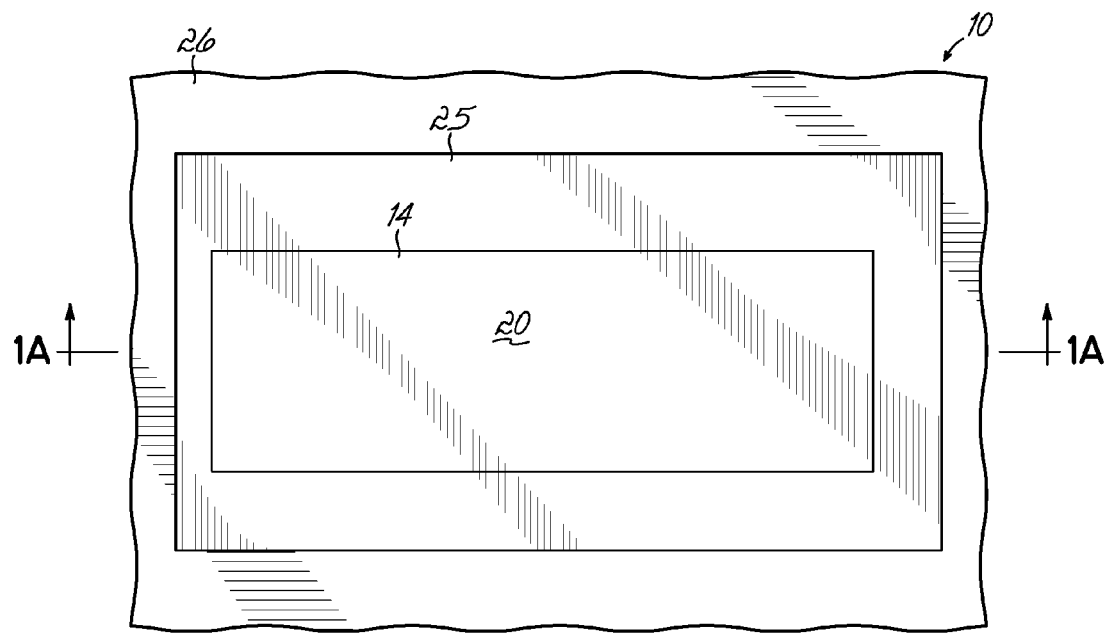
FIG. 1 is a diagrammatic top view of a portion of a substrate in accordance with an embodiment of the invention.
Figure 1A:
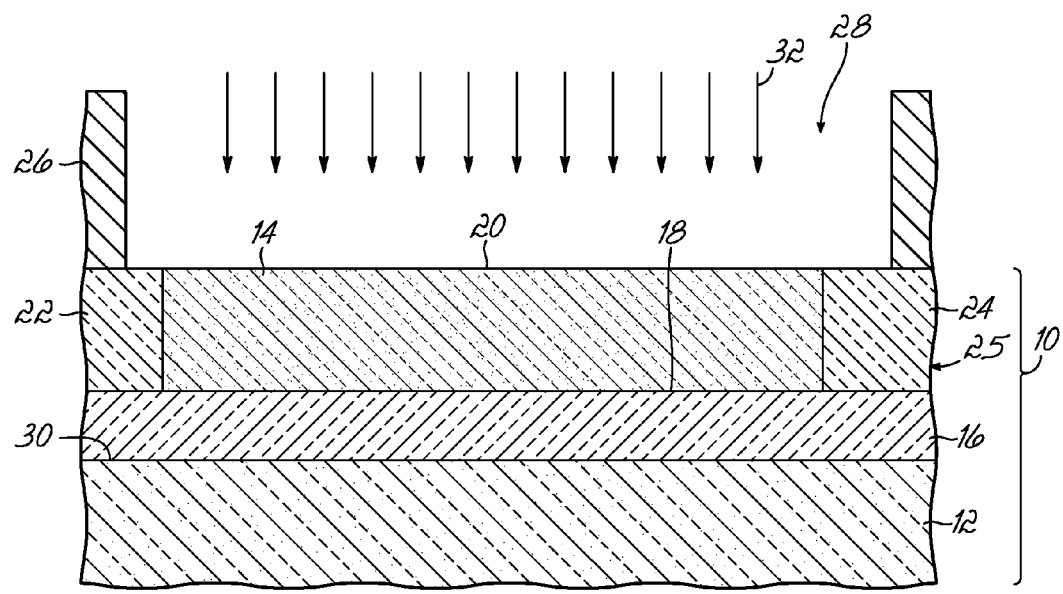
FIG. 1A is a diagrammatic cross-sectional view taken generally along line 1A-1A in FIG. 1.

With reference to FIGS. 1 and 1A, a semiconductor-on-insulator (SOI) substrate 10 includes a handle wafer 12, a device or SOI layer 14, and a buried insulating layer 16 formed of an insulating material. The buried insulating layer 16 may be a buried oxide layer containing silicon dioxide (e.g., $SiO_2$). The SOI layer 14 is separated from the handle wafer 12 by the intervening buried insulating layer 16. The SOI layer 14 is composed of monocrystalline semiconductor material, such as single crystal silicon or another material that contains primarily silicon. The monocrystalline semiconductor material of the SOI layer 14 may contain a definite defect concentration and still be considered single crystal. The handle wafer 12 may also be constituted by a single crystal or monocrystalline semiconductor material, such as silicon, or another type of material. The buried insulating layer 16 electrically isolates the handle wafer 12 from the SOI layer 14, which is considerably thinner than the handle wafer 12 and is in direct contact along a planar interface with a top surface 18 of the buried insulating layer 16. The SOI substrate 10 may be fabricated by any suitable conventional technique, such as wafer bonding techniques or separation by implantation of oxygen (SIMOX) techniques, familiar to a person having ordinary skill in the art.

The SOI layer 14 has a thickness measured from a top surface 20 of SOI layer 14 to the top surface 18 of the buried insulating layer 16. In various specific embodiments, the thickness of the SOI layer 14 may range from about 20 nanometers (nm) to about 200 nm.

An isolation structure 25, which includes a series of continuous dielectric regions, of which dielectric regions 22, 24 are representative, is defined by a conventional process in the SOI layer 14. In one embodiment, the isolation structure 25 is formed by a shallow trench isolation (STI) technique that relies on a conventional lithography and dry etching process to define trenches extending to the buried insulating layer 16, fills the trenches with portions of a dielectric material, and planarizes the layer to the top surface 20 of SOI layer 14 using a chemical mechanical polishing (CMP) process. After the planarization, the residual dielectric material disposed inside the trenches defines the dielectric regions 22, 24 that are embedded in the SOI layer 14. The dielectric material composing the isolation structure 25 may be an oxide, such as densified tetraethylorthosilicate (TEOS) deposited by thermal chemical vapor deposition (CVD) or a high-density plasma (HDP) oxide deposited with plasma assistance. The isolation structure 25, including dielectric regions 22, 24, extend from the top surface 20 of SOI layer 14 to the top surface 18 of the buried insulating layer 16. The isolation structure 25 delineates and bounds a device region of the SOI layer 14, which is electrically isolated from adjacent devices regions (not shown) defined in the SOI layer 14 by additional isolation structures (not shown).

An implantation mask 26 is formed on the top surface 20 of SOI layer 14. In one embodiment, the formation of the mask 26 includes applying a layer of a resist material, exposing the resist layer to a pattern of radiation to create a latent pattern of windows, and developing the exposed resist layer to define actual windows, including the representative opening or window 28, in the resist layer. Each window 28 generally coincides spatially with the locations of the isolation structure 25 and, thereby, exposes the portion of the SOI layer 14 inside the isolation structure 25. The SOI layer 14 is implanted with energetic ions 32 of an impurity species characterized by, for example, an n-type conductivity type in the semiconductor material of the SOI layer 14. The dose and ion kinetic energy are selected such that the ions 32 stop primarily in the SOI layer 14 before reaching a top surface 30 of the handle wafer 12, which defines a planar interface of direct contact along with the overlying buried insulating layer 16, and such that the semiconductor material constituting the SOI layer 14 is lightly doped (e.g., an $n^-$ doping level). A thermal anneal may be required to electrically activate the implanted impurity species, to alleviate implantation damage, and to uniformly re-distribute the impurity species across the entire thickness of the SOI layer 14. The doping of the SOI layer 14 may be the product of a complementary metal-oxide-semiconductor (CMOS) well implant.

Figure 2:
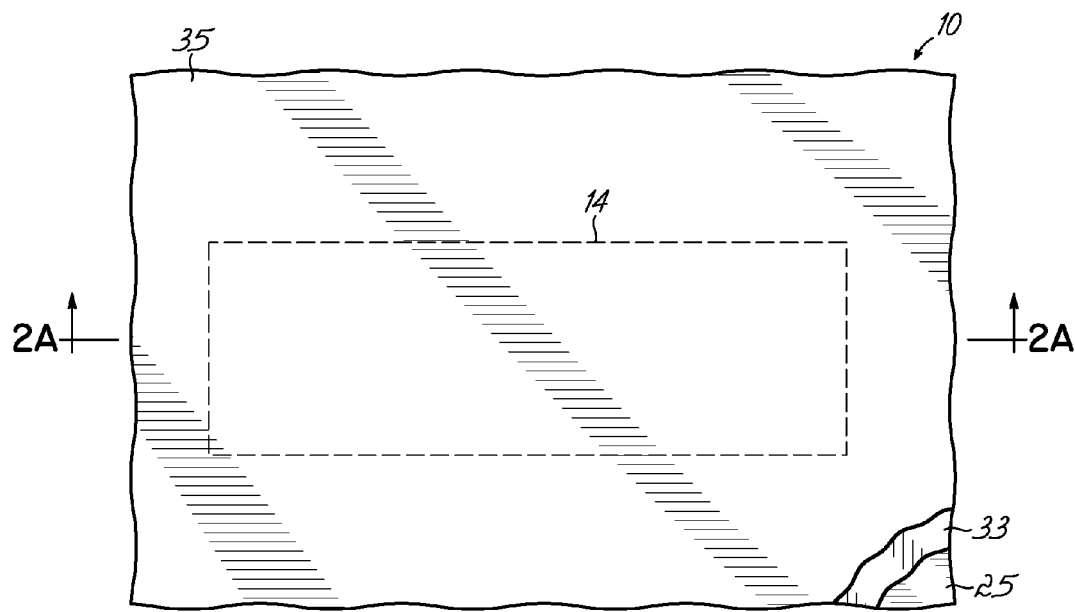
FIGS. 2 and 2A are diagrammatic top and cross-sectional views similar to FIGS. 1 and 1A, respectively, at a subsequent fabrication stage of a processing method in accordance with an embodiment of the invention.
Figure 2A:
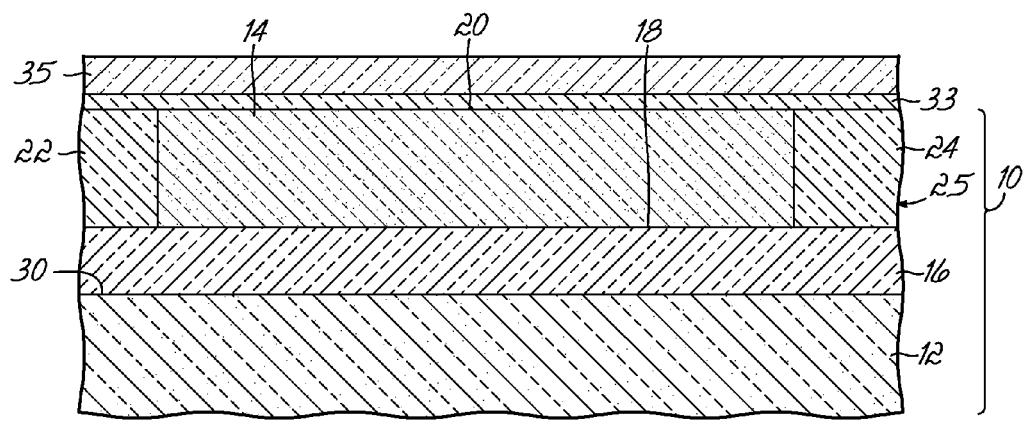

With reference to FIGS. 2 and 2A in which like reference numerals refer to like features in FIGS. 1, 1A and at a subsequent fabrication stage, a thin dielectric layer 33 is formed on the top surface 20 of the SOI layer 14 and also on top of the isolation structure 25. Candidate dielectric materials for dielectric layer 33 include, but are not limited to, silicon oxynitride ($SiO_xN_y$), silicon nitride ($Si_3N_4$), silicon dioxide ($SiO_2$), a hafnium-based dielectric material like hafnium oxide ($HfO_2$) or hafnium oxynitride (HfSiON), and layered stacks of these and other dielectric materials. In one embodiment, the dielectric layer 33 is oxide formed by a wet or dry oxidation process executed as understood by a person having ordinary skill in the art or a deposition process like atomic layer deposition (ALD).

A layer 35 of a material characterized by a sufficiently high electrical conductivity is deposited on the dielectric layer 33. In one embodiment, the conductive material constituting layer 35 is composed of polycrystalline silicon (polysilicon) deposited using a known deposition process, such as physical vapor deposition (PVD) or CVD, and doped to provide sufficient electrical conductivity. The doping of the conductor layer 35 may be provided in-situ during deposition of the polysilicon.

Figure 3:
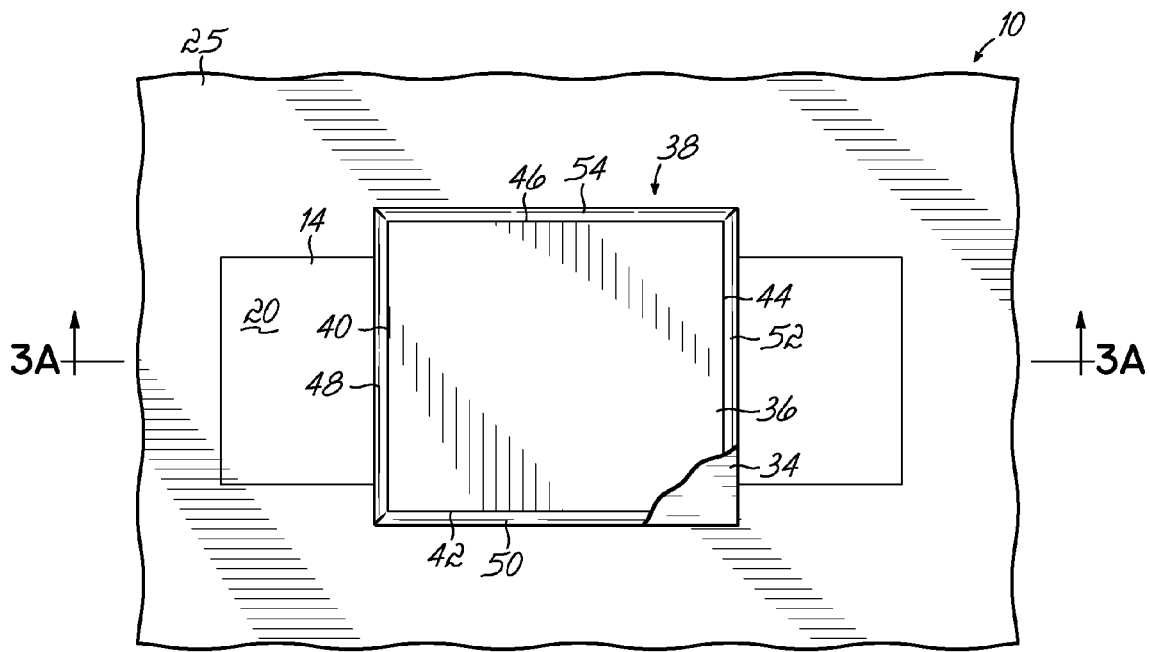
FIGS. 3 and 3A are diagrammatic top and cross-sectional views similar to FIGS. 2 and 2A, respectively, at a subsequent fabrication stage of the processing method.
Figure 3A:
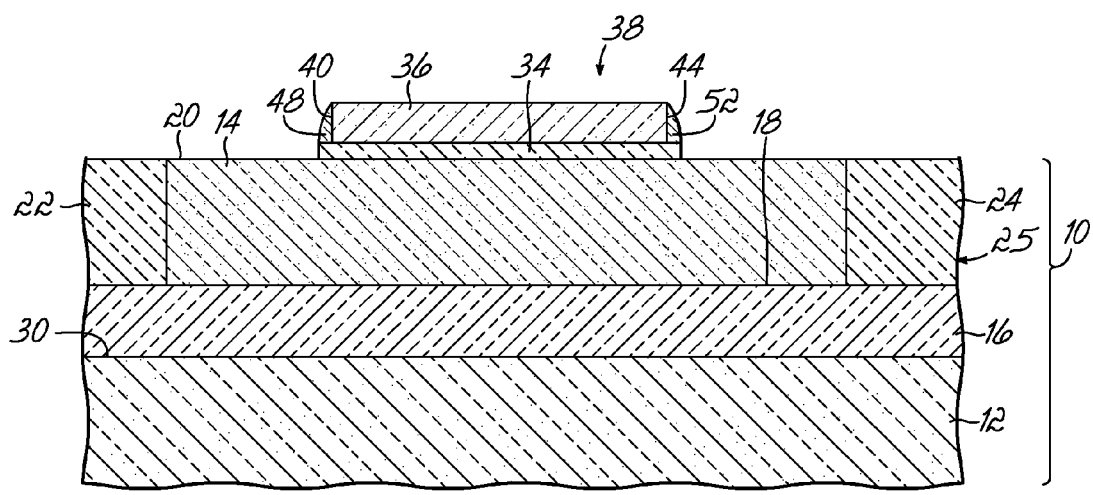

With reference to FIGS. 3 and 3A in which like reference numerals refer to like features in FIGS. 2, 2A and at a subsequent fabrication stage, the dielectric layer 33 and the conductor layer 35 (FIGS. 2, 2A) are patterned by a conventional lithography and etching process to define a gate structure, which is generally indicated by reference numeral 38. In the gate stack of the gate structure 38, a gate conductor layer 36 is fashioned by etching the conductor layer 35 and a gate dielectric layer 34 fashioned by etching the dielectric layer 33. The gate conductor layer 36 is separated from the SOI layer 14 by the gate dielectric layer 34 as the layers 34, 36 project approximately the same footprint onto the SOI layer 14. The gate dielectric layer 34 of the gate structure 38 functions to electrically isolate the gate conductor layer 36 of the gate structure 38 from the semiconductor material of the SOI layer 14. The gate structure 38 is a three-dimensional body, which in the representative embodiment is trapezoidal, that includes sidewalls 40, 42, 44, 46 and a height relative to the top surface 20 of the SOI layer 14 set by the collective thicknesses of the layers 33, 35.

The lithography process entails applying a resist (not shown) and hard mask (not shown) on the conductor layer 35, exposing the resist to a pattern of radiation to create a latent pattern in the resist for the gate structure 38, developing the transferred pattern in the exposed resist, transferring the pattern to the hard mask with a dielectric etching process, and stripping the residual resist with plasma ashing or a chemical stripper. The pattern is transferred from the hard mask to the dielectric layer 33 and conductor layer 35 by an anisotropic etching process, such as reactive-ion etching (RIE) or a plasma etching process. Portions of the dielectric layer 33, which are exposed after the conductor layer 35 is shaped to define the gate conductor layer 36, are removed by the etching process. The anisotropic etching process may be conducted in a single etching step or multiple etching steps with different etch chemistries, including a standard silicon RIE process for forming the gate conductor layer 36. After etching is concluded, the hard mask is removed.

The gate structure 38 further includes dielectric spacers 48, 50, 52, 54 that are applied by a conventional spacer formation process to the respective sidewalls 40, 42, 44, 46 of the shaped gate conductor layer 36. In one embodiment, the dielectric spacers 48, 50, 52, 54 are formed by depositing a blanket layer of an insulator or dielectric, such as $Si_3N_4$, $SiO_2$, or a combination of these materials deposited by CVD, followed by etching the blanket layer using a conventional anisotropic dry etching technique, such as RIE, that remove portions of the blanket dielectric layer from substantially horizontal surfaces at a faster rate than from substantially vertical surfaces. The dielectric spacers 48, 50, 52, 54 remain on the vertical sidewalls 40, 42, 44, 46 of the gate structure 38 after the dielectric layer is completely removed from the adjacent horizontal surfaces.

Figure 4:
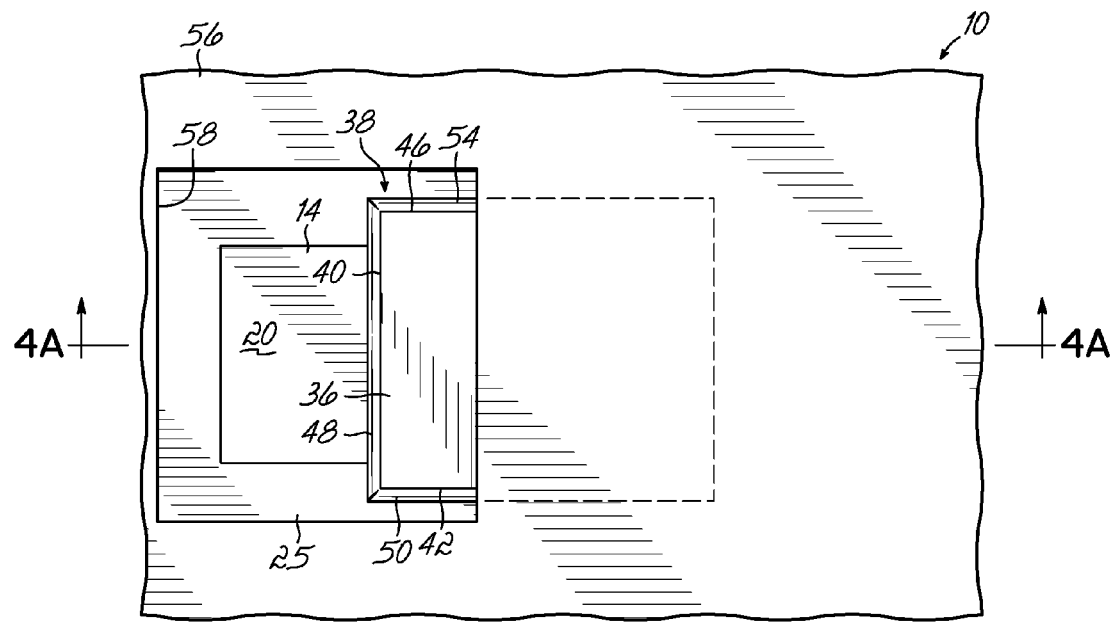
FIGS. 4 and 4A are diagrammatic top and cross-sectional views similar to FIGS. 3 and 3A, respectively, at a subsequent fabrication stage of the processing method.
Figure 4A:
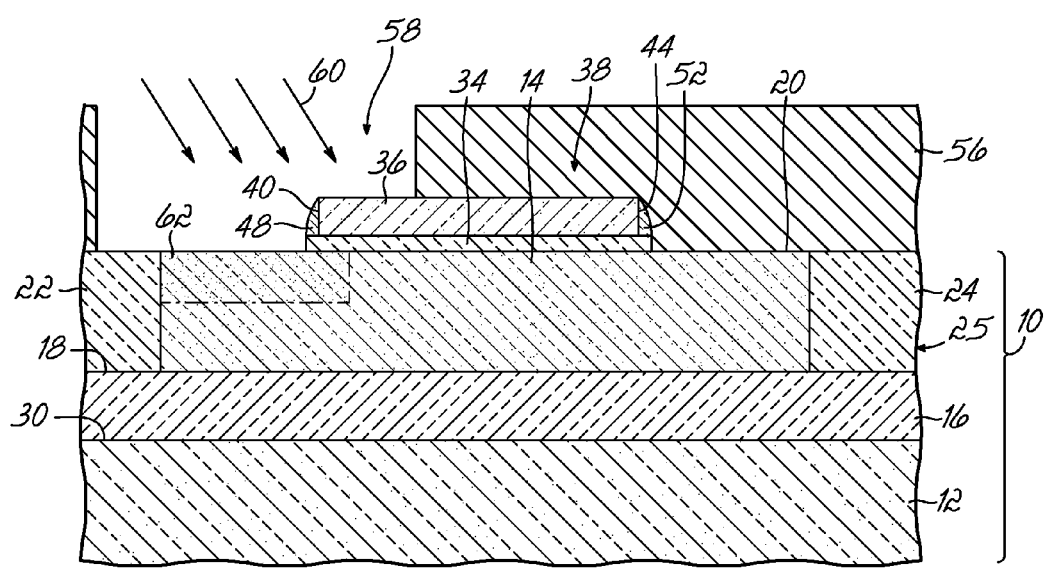

With reference to FIGS. 4 and 4A in which like reference numerals refer to like features in FIGS. 3, 3A and at a subsequent fabrication stage, an implantation mask 56 is formed that includes an opening or window 58 that exposes a portion of the top surface 20 of the SOI layer 14. This exposed SOI layer portion is located adjacent to the dielectric spacer 48 on sidewall 40 of the gate structure 38 and is bounded by the isolation structure 25 and the dielectric spacer 48 on gate structure 38. The mask 56 covers the top surface 20 of SOI layer 14 adjacent to sidewall 44 of the gate structure 38 and partially overlaps with the gate structure 38. In one embodiment, the mask 56 is formed by applying a layer of a resist material, exposing the resist layer to a pattern of radiation to create a latent pattern of windows, and developing the exposed resist layer to define actual windows, including the representative window 58, in the resist layer.

A moderately-doped doped region 62 is defined in the SOI layer 14 by implanting the SOI layer 14 through the window 58 in mask 56 using an angled implantation process with energetic ions 60 of an impurity species characterized by the same conductivity type in the semiconductor material of the SOI layer 14 as the impurity species introduced by ions 32 (FIGS. 1, 1A) into the entire, unmasked SOI layer 14. For example, if the impurity species introduced by ions 32 has an n-type conductivity, then the impurity species introduced by ions 60 likewise will have an n-type conductivity and a moderate doping level in comparison with the remainder of the lightly doped SOI layer 14 at this fabrication stage. Suitable n-type impurities in silicon are Group V dopants that include, but are not limited to, arsenic, phosphorus, and antimony. The dose of ions 60 is selected to dope the semiconductor material constituting the SOI layer 14 at an appropriate dopant concentration selected for the device design.

The ion kinetic energy is selected such that the ions 60 stop within the SOI layer 14 at a depth between the top surface 20 of the SOI layer and the top surface 18 of the buried insulating layer 16. The particular kinetic energy chosen for ions 60 will depend, among other factors, on dopant choice and the thickness of the SOI layer 14. As the ions 60 penetrate into the SOI layer 14, the ions 60 dissipate kinetic energy via nuclear and electronic scattering events with the semiconductor material constituting SOI layer 14. The ions 60 eventually stop in the SOI layer 14 beneath the top surface 20. The thickness of mask 56 is selected based upon the chosen ion kinetic energy and implanted species such that the portion of the SOI layer 14 adjacent to the sidewall 44 of gate structure 38 and bounded by the isolation structure 25 and dielectric spacer 52 does not receive a dose of ions 60.

The depth profile of the atomic concentration of the impurity species implanted by ions 60 may be characterized by a distribution with a peak concentration at a projected range and a range straggle that represents a standard deviation or second moment about the projected range. The projected range of the depth profile is measured relative to the top surface 20. Because of the inclination of the angled implantation process used to introduce the ions 60, the doped region 62 also extends laterally beneath the sidewall 40 of the gate structure 38 and dielectric spacer 48.

The terms "angled implantation" and "angled ion implantation" is defined as an ion implantation process conducted with ion trajectories traveling at incident angles that impinge the top surface 20 of SOI layer 14 other than 0°, where 0° is a direction normal (i.e., perpendicular) to top surface 20. Thus, the term "angled implantation" refers to ion implantation conducted at angles of incidence for the impinging ion trajectories bounded within a numerical range greater than 0° to less than 90°. In one embodiment, the ions 60 are implanted at an angle that, on average, is at least 5° from normal incidence. In other embodiments, the incident angle at which the ions 60 are implanted may range from about 5° to about 85° from normal, from about 10° to about 60° from normal, from about 20° to about 40° from normal, and typically will be about 30° from normal.

Figure 5:
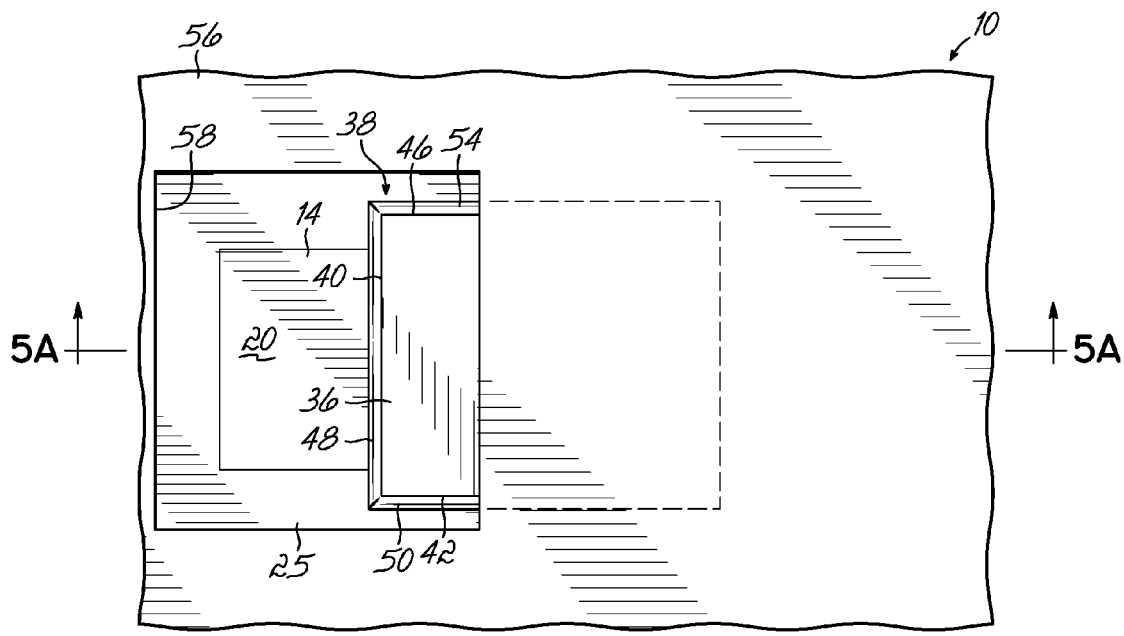
FIGS. 5 and 5A are diagrammatic top and cross-sectional views similar to FIGS. 4 and 4A, respectively, at a subsequent fabrication stage of the processing method.
Figure 5A:
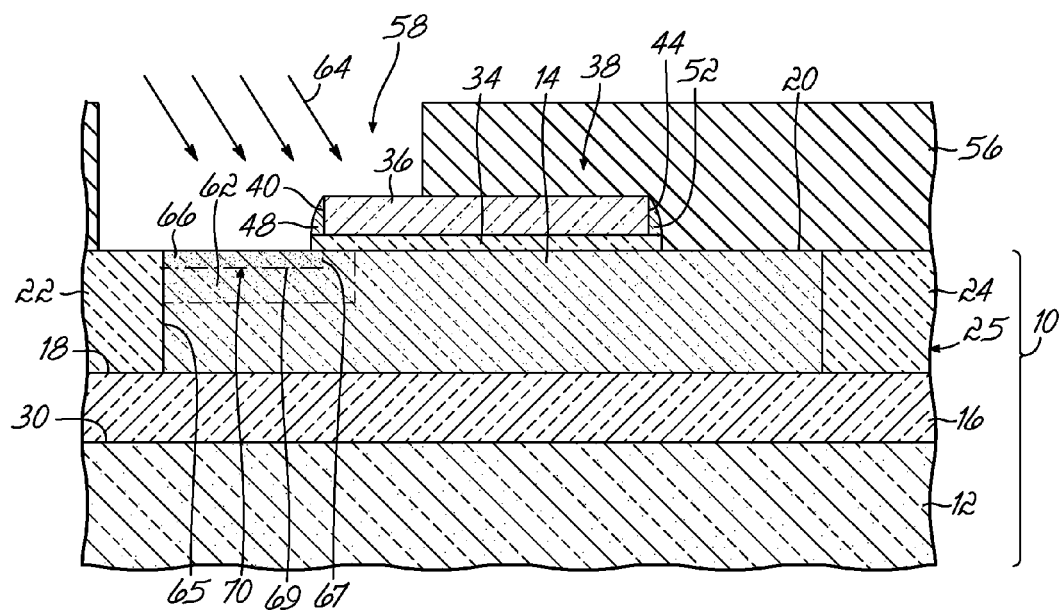

With reference to FIGS. 5 and 5A in which like reference numerals refer to like features in FIGS. 4, 4A and at a subsequent fabrication stage, a heavily-doped region 66 is defined in the SOI layer 14 using an implantation process that directs energetic ions 64 through the window 58 in mask 56 and implants the ions 64 in region 66. The ions 64 consist of an impurity species characterized by an opposite conductivity type from the impurity species introduced by ions 32 (FIGS. 1, 1A) into the entire SOI layer 14 and by ions 60 (FIGS. 4, 4A) into region 62. For example, if the impurity species introduced by ions 60 has an n-type conductivity, then the impurity species introduced by ions 64 will have a p-type conductivity and the doping level is $p^+$. Suitable p-type impurities are Group III dopants that include, but are not limited to, boron or indium. The window 58 in the mask 56 ensures that only region 66 is doped with the impurity species introduced by ions 64. The thickness of mask 56, which is conditioned on protecting the masked portion of the SOI layer 14 against the implantation of ions 60 (FIGS. 4, 4A), is also selected based upon the ion kinetic energy and the ion species such that the portion of the SOI layer 14 adjacent to the sidewall 44 of gate structure 38 and bounded by the isolation structure 25 and dielectric spacer 52 does not receive a dose of ions 64.

Similar to the depth profile for the impurity species in region 62, the depth profile of the atomic concentration of the impurity species implanted to form region 66 may be characterized by a statistical distribution with a peak concentration located at a projected range and a range straggle that represents a deviation or second moment of the distribution about the projected range. The projected range for the depth profile is measured relative to the top surface 20.

The depth profile for the impurity species implanted to form region 66 spatially overlaps with the depth profile of the impurity species forming region 62. Region 66, which is effectively formed by counterdoping a volume of region 62, has an opposite conductivity type to region 62. As a result, the doped region 66 is electrically isolated and physically separated from the remainder of the SOI layer 14 by the doped region 62. Region 62 effective forms a tub in the SOI layer 14 that surrounds the region 66 characterized by opposite polarity or conductivity type.

The spatial overlap of the depth profiles causes compensation to occur between the impurity species of opposite conductivity type after activation by an annealing process. This compensation defines a p-n junction 70 that is characterized as hyper-abrupt along the transition between the semiconductor material doped with impurity species of opposite conductivity types. The boundary that delineates region 66 in FIGS. 5, 5A demarks full compensation for which the net doping level in the doping profile is nil (i.e., transitions from n-type conductivity to p-type conductivity) and coincides with the location of the hyper-abrupt p-n junction 70. In the latter regard, the depletion width of the junction 70 is localized about the transition in the doping profile between regions 62 and 66 when the varactor diode 80 is biased and operating. The implantation conditions, including but not limited to dose, impurity species, and ion kinetic energy, are selected such that the depth profile of the impurity species forming region 66 in the SOI layer 14 overlaps with the depth profile forming region 62 to supply a dopant profile that positions the hyper-abrupt p-n junction 70 at a targeted depth within the SOI layer 14.

The boundary delineating region 66 and, therefore, the conductivity-type transition in the net doping profile coincides with the spatial location of the hyper-abrupt p-n junction 70. Junction 70 includes a vertical boundary or segment 69 that is contained generally in a plane parallel with and spaced from a plane containing the top surface 20 of the SOI layer 14. The overlap in the implanted dopant profiles provides the abrupt transition along the vertical segment 69 at a given depth within the SOI layer 14 measured relative to the top surface 20.

Junction 70 also includes a lateral boundary or segment 67 extending from the vertical segment 69 toward the top surface 20. The lateral segment 67 is contained generally in a plane orthogonal to the plane containing the top surface 20 of the SOI layer 14. The gate structure 38 and dielectric spacer 48 operate as a mask that effectively self-aligns regions 62, 66 with each other and relative to the dielectric spacer 48 and, effectively, relative to the sidewall 40 of the gate structure 38. The self-alignment operates to spatially define the location of the lateral segment 67 that supplies the lateral boundary of the hyper-abrupt p-n junction 70. The gate structure 38 and dielectric spacer 48 cooperate to supply a common mask for both ions 60 and ions 64. The lateral segment 67 of the hyper-abrupt p-n junction 70 may be located beneath the dielectric spacer 48 or, if the lateral penetration of ions 64 forming region 66 is sufficient, beneath the gate structure 38.

In one embodiment, ions 64 may be introduced into the SOI layer 14 with an angled ion implantation process. The inclination of the angled implantation processes, as well as the lateral straggle of the ions 64 as they penetrate into the SOI layer 14 and stop as the kinetic energy is dissipated by collisions, are among the factors that determine the location of the lateral segment 67. However, the implantation conditions must be selected such that extent of the lateral penetration of the implanted ions 64 beneath the gate structure 38 and dielectric spacer 48 is reduced in comparison with the lateral penetration of the implanted ions 60 beneath the gate structure 38 and dielectric spacer 48.

The incident angle at which ions 64 are implanted into the SOI layer 14 during the angled implantation process may be approximately equal to the incident angle at which ions 60 are implanted into the SOI layer. Alternatively, the incident angle for ions 64 may differ from the incident angle of the ions 60. Generally, the incident angle for ions 64 is within a numerical range greater than 0° to less than 90°. In one embodiment, the ions 64 are implanted at an angle that, on average, is at least 5° from normal incidence. In other embodiments, the angle at which the ions 64 are implanted may range from about 5° to about 85° from normal, from about 10° to about 60° from normal, from about 20° to about 40° from normal, and typically will be about 30° from normal.

In an alternative embodiment, the gate structure 38 and dielectric spacer 48 may be replaced with a sacrificial structure that is removed after the regions 62, 66 are defined using mask 56. Although not shown, the sacrificial structure would contact the SOI layer 14 with a footprint similar to the footprint of the gate structure 38 and participate in the self-alignment process that defines the lateral segment 67 of the junction 70. In this embodiment, the gate dielectric layer 34 and gate structure 38 are fabricated after the ion implantations are performed and the sacrificial structure is removed.

In another alternative embodiment, the trajectories of the ions 64 implanted to dope the semiconductor material in region 66 may be oriented approximately normal (with a near 0° incident angle) to the top surface 20 of the SOI layer 14. In this instance, the only contribution of the implantation process causing the region 66 to extend laterally beneath the gate structure 38 and dielectric spacer 48 will be lateral straggle. As a result, the lateral segment 67 of region 66 will be approximately aligned vertically with the dielectric spacer 48, but will still be circumscribed inside region 62.

Figure 6:
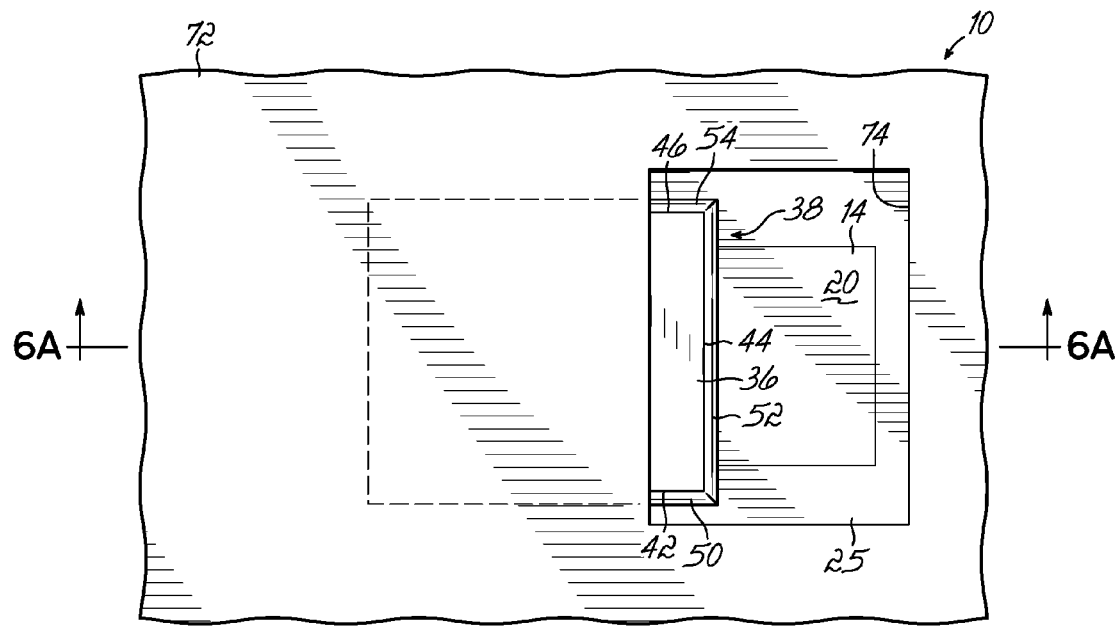
FIGS. 6 and 6A are diagrammatic top and cross-sectional views similar to FIGS. 5 and 5A, respectively, at a subsequent fabrication stage of the processing method.
Figure 6A:
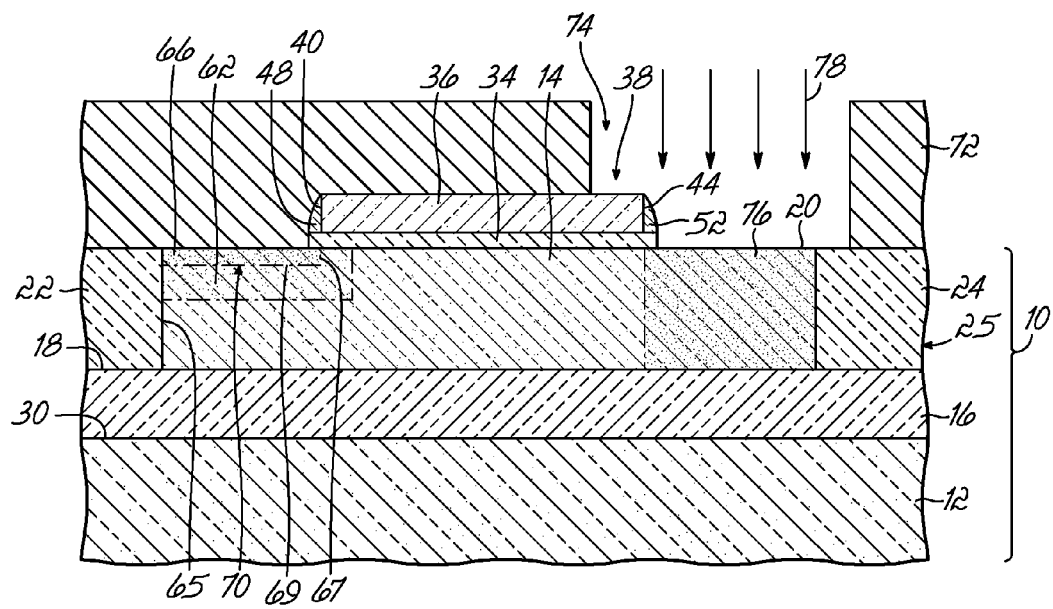

With reference to FIGS. 6 and 6A in which like reference numerals refer to like features in FIGS. 5, 5A and at a subsequent fabrication stage, mask 56 (FIGS. 5, 5A) is stripped using, for example, plasma ashing or a chemical stripper like a piranha etch. Another implantation mask 72 is then formed that includes an opening or window 74 that partially exposes the top surface 20 of the SOI layer 14 adjacent to the sidewall 44 of gate structure 38. The mask 72 covers the top surface 20 of SOI layer 14 adjacent to sidewall 40 of the gate structure 38 and partially overlaps with the gate structure 38. Mask 72 is formed by applying a layer of a resist material, exposing the resist layer to a pattern of radiation to create a latent pattern of windows, and developing the exposed resist layer to define windows, including the representative window 74, in the resist layer.

A heavily-doped region 76 is defined in the SOI layer 14 using an ion implantation process that directs energetic ions 78 through the window 74 in mask 72 and implants the ions 78 in region 76. The ions 78 consist of an impurity species characterized by the same conductivity type as the impurity species introduced by ions 32 (FIG. 1) and ions 78 (FIG. 4) into region 76. For example, if the impurity species introduced by ions 32 has an n-type conductivity, then the impurity species introduced by ions 78 will have a n-type conductivity. The window 74 in the mask 72 ensures that only region 76 is doped with the impurity species introduced by ions 78.

In one embodiment, regions 62, 66 may be formed during a typical CMOS process flow that is fabricating field effect transistors (not shown) on other regions of the SOI substrate 10. Specifically, the shallow source/drain extensions and halo regions used to form these field effect transistors may be used to form regions 62, 66. Halo regions and shallow source/drain extensions, which are typically formed by angled ion implantation processes so that the implanted ions penetrate into the body beneath the gate electrode, have opposite conductivity type and cooperate to control source-to-drain leakage currents when the transistor is quiescent. Similarly, region 76 may be formed when the source and drain regions of one type of CMOS field effect transistor, for example the n-channel field effect transistors, are formed. Consequently, the varactor diode 80 may formed by a CMOS process forming field effect transistors with only one additional mask 56 required to define regions 62, 66.

Figure 7:
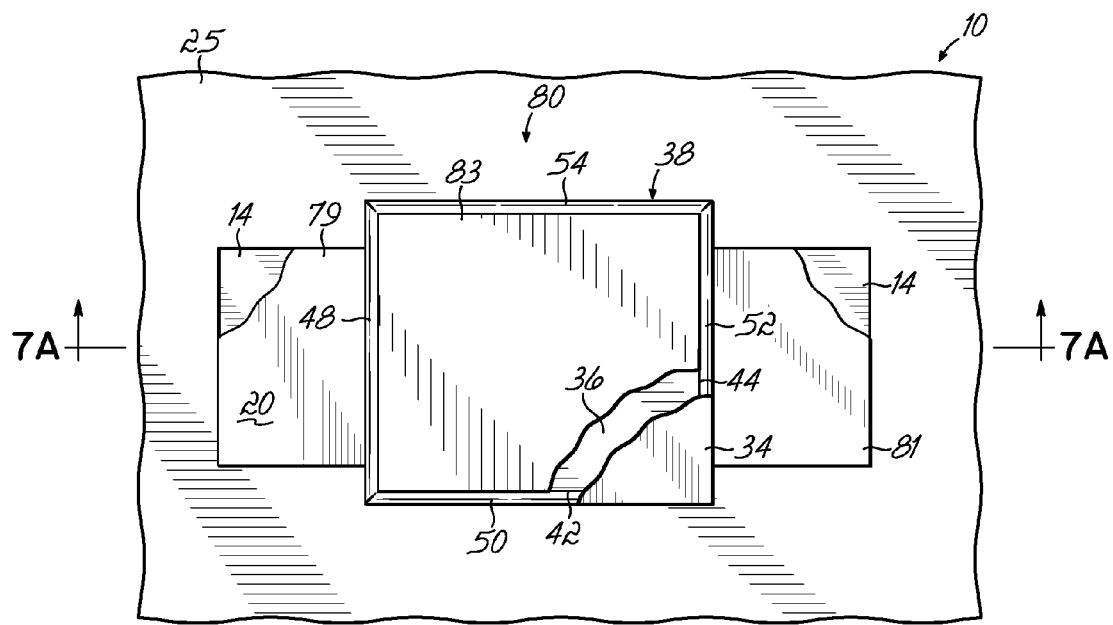
FIGS. 7 and 7A are diagrammatic top and cross-sectional views similar to FIGS. 6 and 6A, respectively, at a subsequent fabrication stage of the processing method.
Figure 7A:
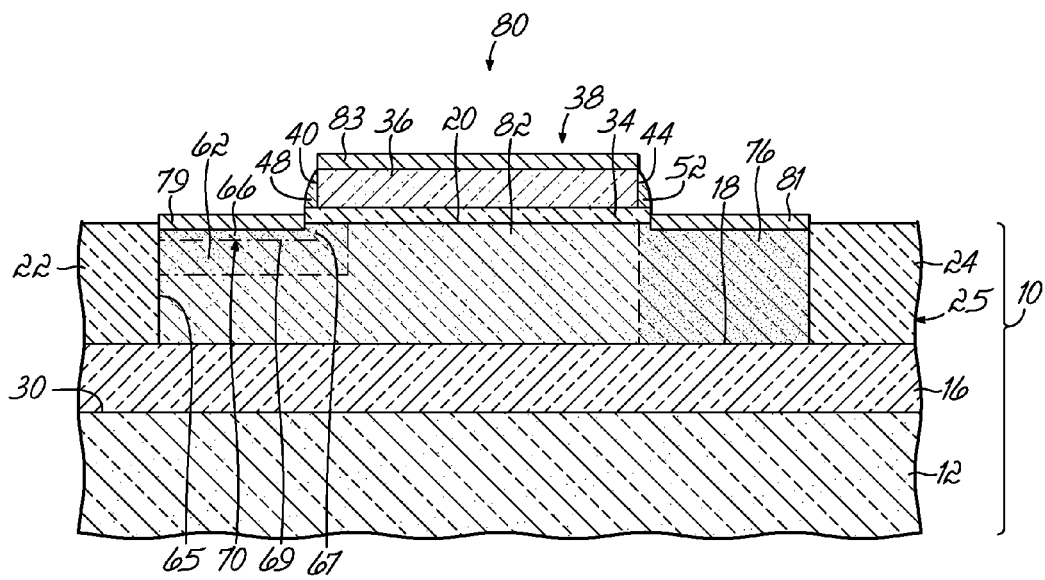

With reference to FIGS. 7 and 7A in which like reference numerals refer to like features in FIGS. 6, 6A and at a subsequent fabrication stage, mask 72 (FIGS. 6, 6A) is stripped using, for example, plasma ashing or a chemical stripper. The resulting device structure is a voltage-controlled hyperabrupt junction varactor diode, which is generally indicated with reference numeral 80, that includes the gate structure 38, the heavily-doped region 66 as an anode, and the heavily-doped region 76, the moderately-doped region 62, and a lightly-doped region 82 beneath the gate structure 38 that operate as a graded cathode of opposite conductivity type to the anode. As apparent, region 82 of the cathode has a lower doping concentration of the impurity species than region 62 and region 76 has a higher doping concentration of the impurity species than region 62 or region 82. Region 82 extends in the SOI layer 14 beneath the gate structure 38 to electrically connect regions 62 and 76.

As described above, the overlap between regions 62, 66 defines the hyper-abrupt p-n junction 70 across which the net doping abruptly changes from one conductivity type to the opposite conductivity type. A control voltage can be applied to the gate structure 38 regulates carrier flow in the cathode through region 82 from the junction 70 to the terminal defined by the heavily-doped region 76, but typically junction diodes are two terminal devices used in reverse biased mode with simply an anode and cathode terminal as defined by region 66 and region 76, respectively.

To supply low resistance electrical connections for contacts (not shown) in the overlying local metallization level, silicide regions 79, 81 are formed on doped regions 62 and 76. If the gate structure 38 is composed of polysilicon, a silicide region 83 may also be formed on the gate structure 38 by the process forming silicide regions 79, 81. The silicide regions 79, 81, 83 may contain a silicide-forming metal, such as titanium (Ti), cobalt (Co), tungsten (W), or nickel (Ni), and may be formed using a conventional process familiar to a person having ordinary skill in the art. Generally, a standard silicidation process includes depositing a layer of the silicide-forming metal and annealing at a high temperature in a controlled atmosphere to promote a reaction with silicon in contact with the metal layer to form a metal silicide. Silicide does not form during the silicidation process on the portion of the SOI layer 14 covered by the footprint of the gate structure 38 or on the isolation structure 25. The silicide-forming metal can be deposited utilizing any deposition process known to those skilled in the art including, but are not limited to, PVD, CVD, and chemical solution deposition. Silicidation annealing conditions may vary contingent upon the type of silicide-forming metal, but are nonetheless familiar to a person having ordinary skill in the art.

During the fabrication process, the varactor diode 80 is replicated across at least a portion of the surface area of the SOI layer 14 of the SOI substrate 10. Standard processing follows, which includes formation of metallic contacts, metallization for the M1 level interconnect wiring, and interlayer dielectric layers, conductive vias, and metallization for upper level (M2-level, M3-level, etc.) interconnect wiring. Metallization in the contact level of the interconnect wiring establishes electrical connections with the gate structure 38 and independent electrical connections with the anode and cathode defined by doped regions of the SOI layer 14.

Device structures having different physical layouts and structural arrangements may be formed in a manner similar to varactor diode 80 (FIGS. 7, 7A). A representative alternative structural arrangement is described hereinbelow for a device structure in the form of a voltage-controlled varactor diode 84 that has a different structural layout than varactor diode 80 (FIGS. 7, 7A).

Figure 8:
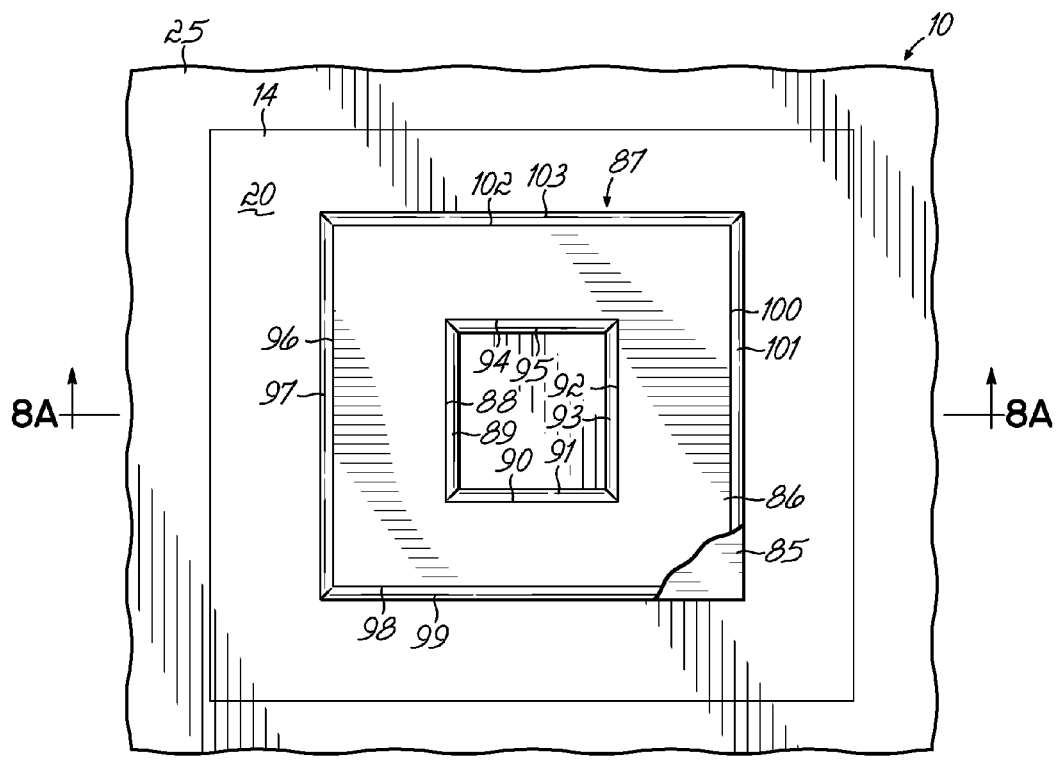
FIGS. 8 and 8A are diagrammatic top and cross-sectional views similar to FIGS. 3 and 3A, respectively, at a fabrication stage subsequent to FIGS. 2 and 2A of a processing method in accordance with an alternative embodiment of the invention.
Figure 8A:
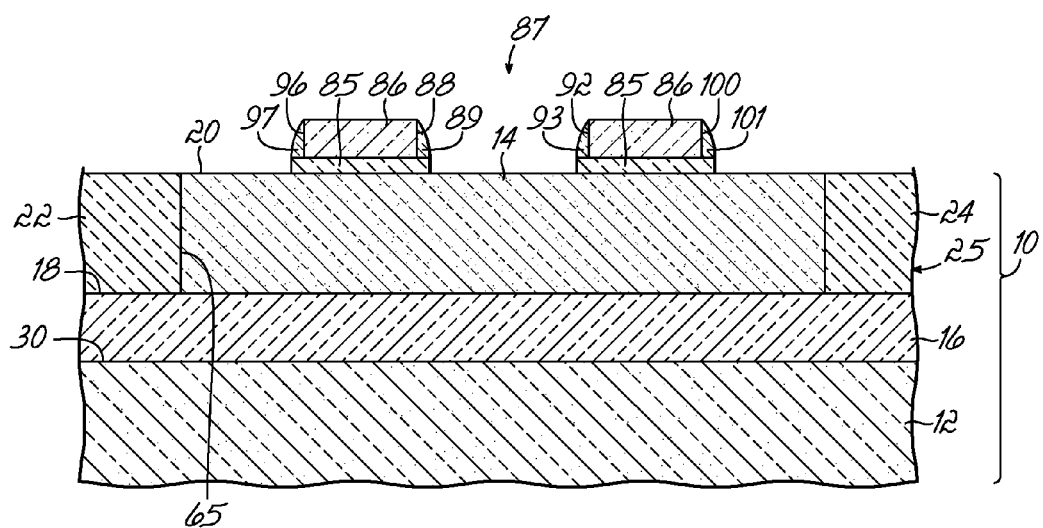

With reference to FIGS. 8 and 8A in which like reference numerals refer to like features in FIGS. 2, 2A and at a subsequent fabrication stage in accordance with an alternative embodiment of the invention, a gate structure 87 is formed in a manner similar to gate structure 38 (FIGS. 3, 3A) by a conventional lithography and etching process. The gate structure 87 includes a gate conductor layer 86 fashioned from a portion of the conductor layer 35 in a manner similar to gate conductor layer 36 (FIGS. 2, 2A). Gate structure 87 further includes a gate dielectric layer 85, which is constructed from dielectric layer 33 in a manner similar to gate dielectric layer 34 (FIGS. 3, 3A), that separates the gate conductor layer 86 from the SOI layer 14 in the gate stack.

The gate conductor layer 86 of gate structure 87 is shaped to have an inner periphery consisting of interconnected sidewalls 88, 90, 92, 94 and an outer periphery consisting of interconnected sidewalls 96, 98, 100, 102. One portion of the top surface 20 of the SOI layer 14 is exposed inside the sidewalls 88, 90, 92, 94 and is encircled by sidewalls 88, 90, 92, 94. Another portion of the top surface 20 of the SOI layer 14 is exposed between the sidewalls 96, 98, 100, 102 of gate structure 87 and the inner periphery 65 of the isolation structure 25. The gate structure 87 includes dielectric spacers 89, 91, 93, 95, which are similar in construction to dielectric spacers 48, 50, 52, 54 (FIGS. 3, 3A), formed on the sidewalls 88, 90, 92, 94, respectively, and dielectric spacers 97, 99, 101, 103, which are also similar in construction to dielectric spacers 48, 50, 52, 54, formed on the sidewalls 96, 98, 100, 102, respectively.

Figure 9:
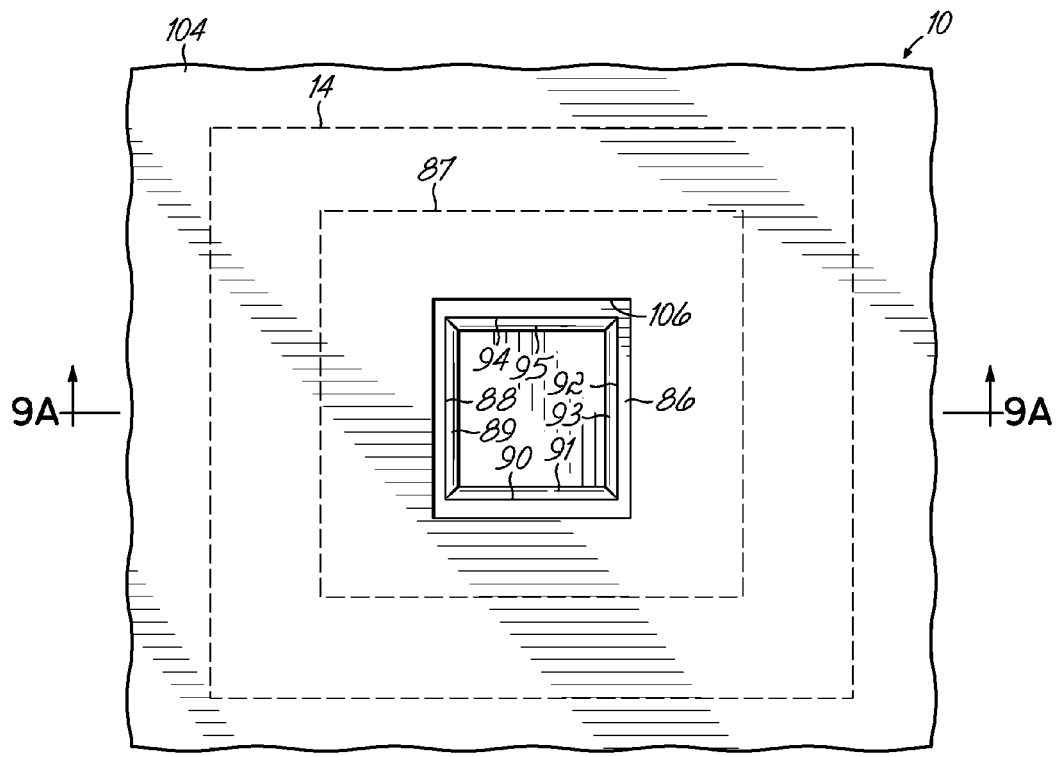
FIGS. 9 and 9A are diagrammatic top and cross-sectional views similar to FIGS. 8 and 8A, respectively, at a subsequent fabrication stage of the processing method.
Figure 9A:
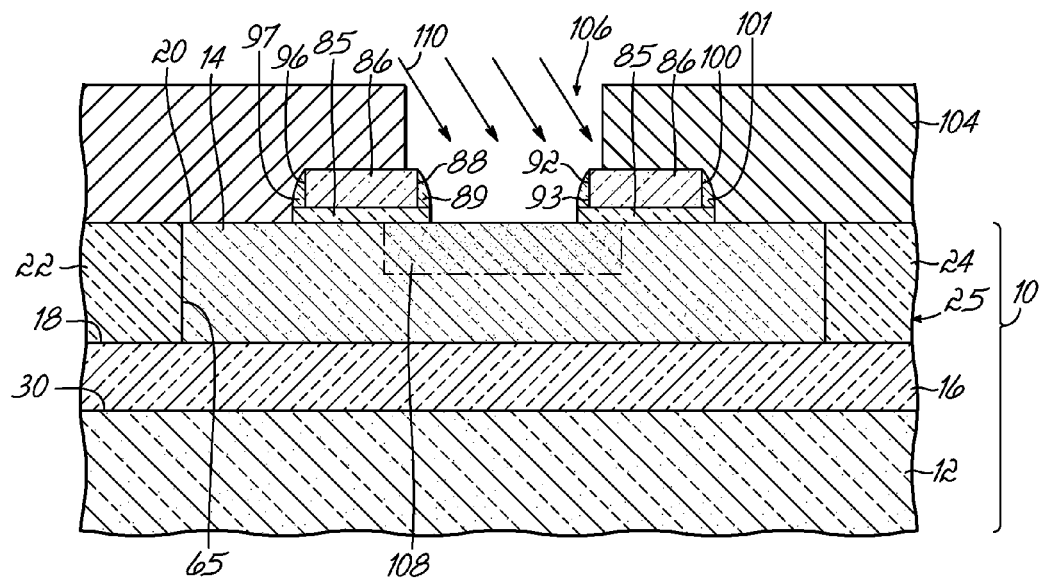

With reference to FIGS. 9 and 9A in which like reference numerals refer to like features in FIGS. 8, 8A and at a subsequent fabrication stage, an implantation mask 104, which is similar in construction to implantation mask 56 (FIGS. 4, 4A), is formed that covers the top surface 20 of SOI layer 14 between the sidewalls 96, 98, 100, 102 of gate structure 87 and the inner periphery 65 of the isolation structure 25 and that partially overlaps with the gate structure 87. The mask 104 includes an opening or window 106 that exposes a portion of the top surface 20 of the SOI layer 14 inside sidewalls 88, 90, 92, 94 and dielectric spacers 89, 91, 93, 95. A moderately-doped region 108, which is similar in construction to doped region 62, is defined in the SOI layer 14 by implanting the SOI layer 14 through the window 106 in mask 104 using an angled implantation process, as described above in the context of FIGS. 4, 4A, with energetic ions 110 similar to ions 60 (FIGS. 4, 4A). Because of the construction of the gate structure 87, the angled implantation process is performed with the SOI substrate 10 oriented at a plurality of angular orientations (for example, four π/2 angular orientations of the same rotation sense) so that the ions 110 penetrate beneath each of the dielectric spacers 89, 91, 93, 95 and, if implantation conditions are appropriate, beneath each of the sidewalls 88, 90, 92, 94 of gate structure 87.

Figure 10:
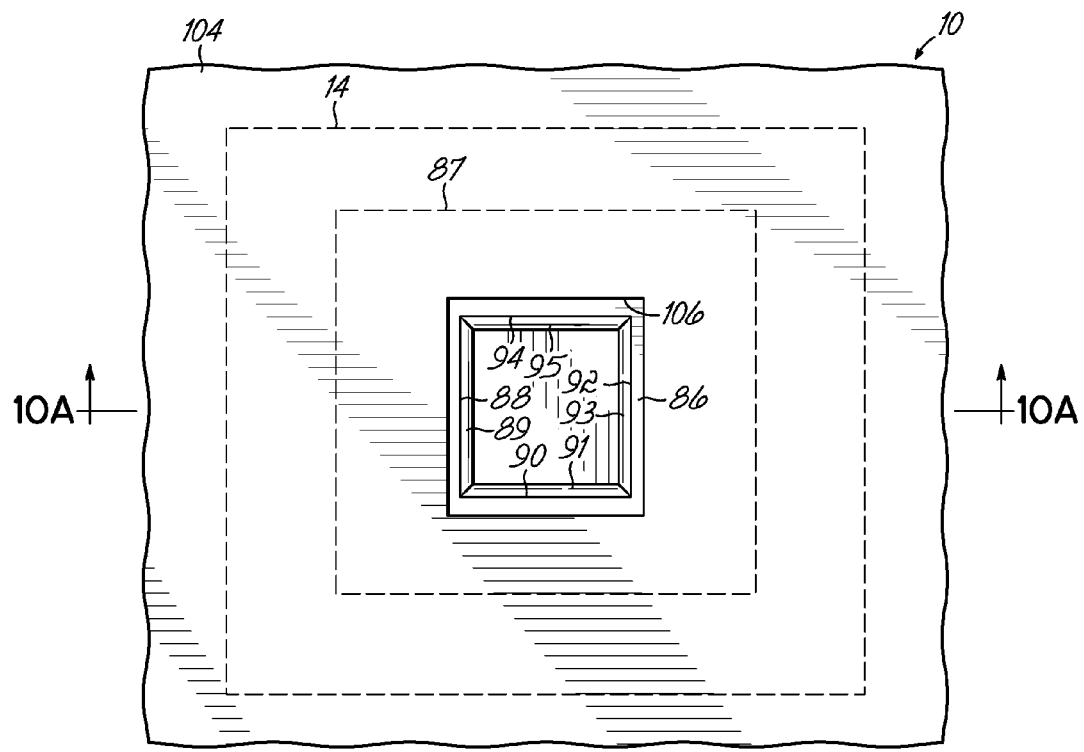
FIGS. 10 and 10A are diagrammatic top and cross-sectional views similar to FIGS. 9 and 9A, respectively, at a subsequent fabrication stage of the processing method.
Figure 10A:
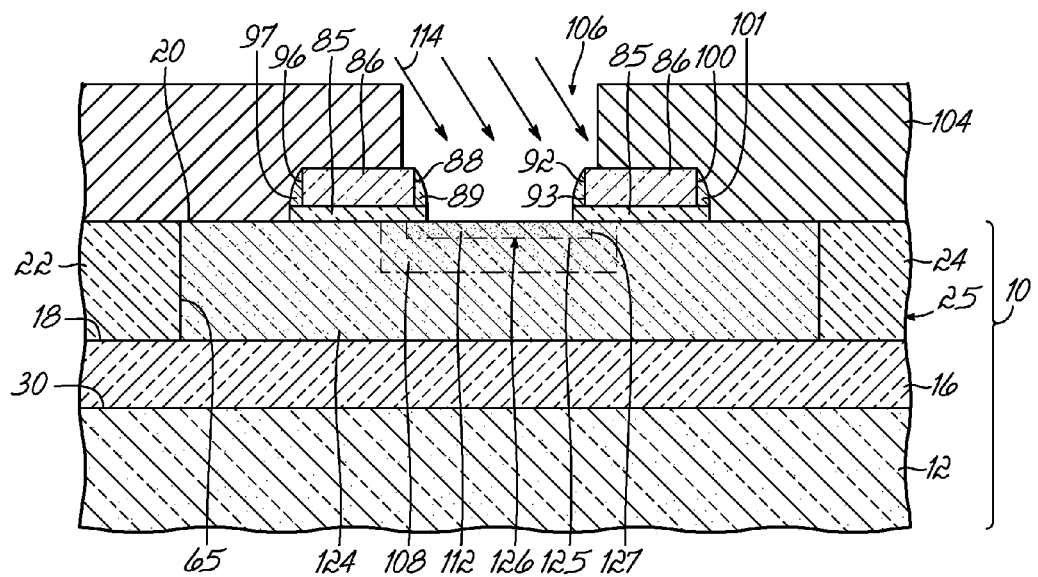

With reference to FIGS. 10 and 10A in which like reference numerals refer to like features in FIGS. 9, 9A and at a subsequent fabrication stage, a heavily-doped region 112, which is similar in construction to doped region 66, is defined in the SOI layer 14 using an implantation process that directs energetic ions 114, similar to ions 60 (FIGS. 5, 5A), through the window 106 in mask 104 and implants the ions 114 in region 112. The semiconductor material in doped region 112 has an opposite conductivity type in comparison with the semiconductor material in doped region 108. The ions 114 may be implanted into the SOI layer 14 with an angled ion implantation process or, alternatively, at normal incidence. For an angled ion implantation process, the angled implantation process is performed with the SOI substrate 10 oriented at a plurality of angular orientations (for example, four π/2 angular orientations of the same rotation sense) so that region 112 extends laterally in the SOI layer 14 beneath the dielectric spacers 89, 91, 93, 95 and, if implantation conditions are appropriate, beneath each of the sidewalls 88, 90, 92, 94 of gate structure 87.

The gate structure 87 operates as a mask that effectively self-aligns regions 108, 112 with each other and also self-aligns regions 108, 112 relative to the sidewalls 88, 90, 92, 94 and dielectric spacers 89, 91, 93, 95 of the gate structure 87. The self-alignment and spatial relationships of regions 108, 112 are similar to the self-alignment and spatial relationships of the regions 62, 66, as described hereinabove. The overlapping regions 108, 112 define a hyper-abrupt p-n junction 126, which is similar to hyper-abrupt p-n junction 70 (FIGS. 7, 7A), across which the net doping abruptly changes from one conductivity type to the opposite conductivity type. The junction 126 includes a vertical edge or segment 125, which is similar to vertical segment 69 of junction 70 (FIGS. 5, 5A) and a lateral edge or segment 127, which is similar to the lateral segment 67 of junction 70.

Figure 11:
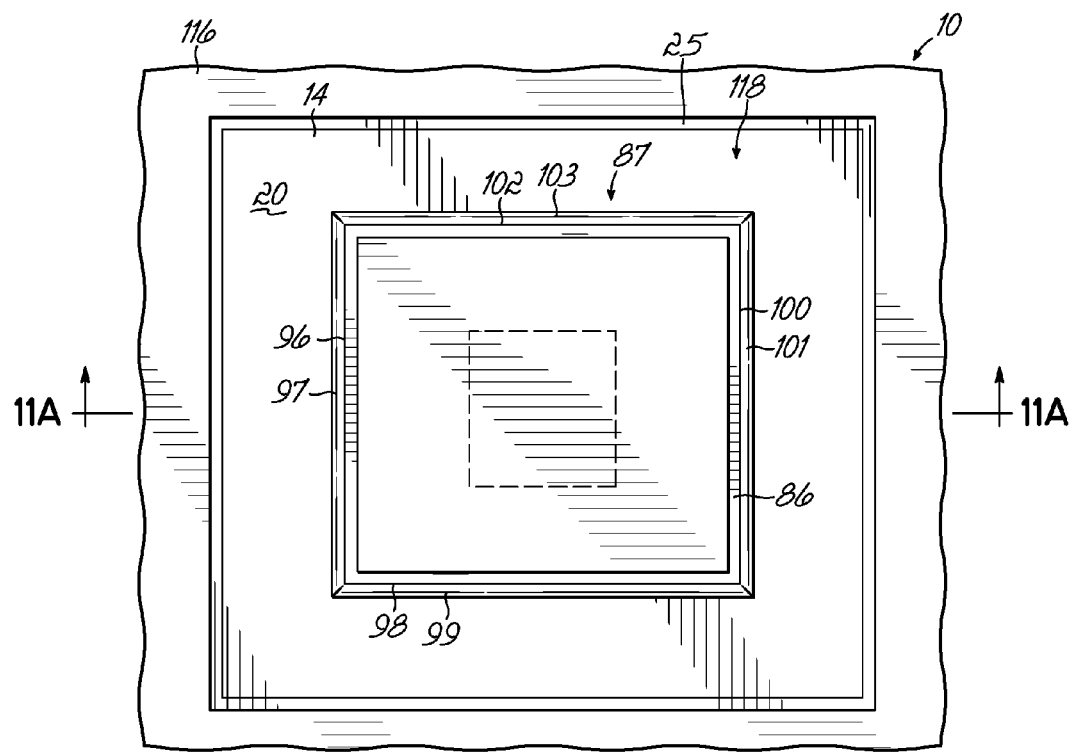
FIGS. 11 and 11A are diagrammatic top and cross-sectional views similar to FIGS. 10 and 10A, respectively, at a subsequent fabrication stage of the processing method.
Figure 11A:
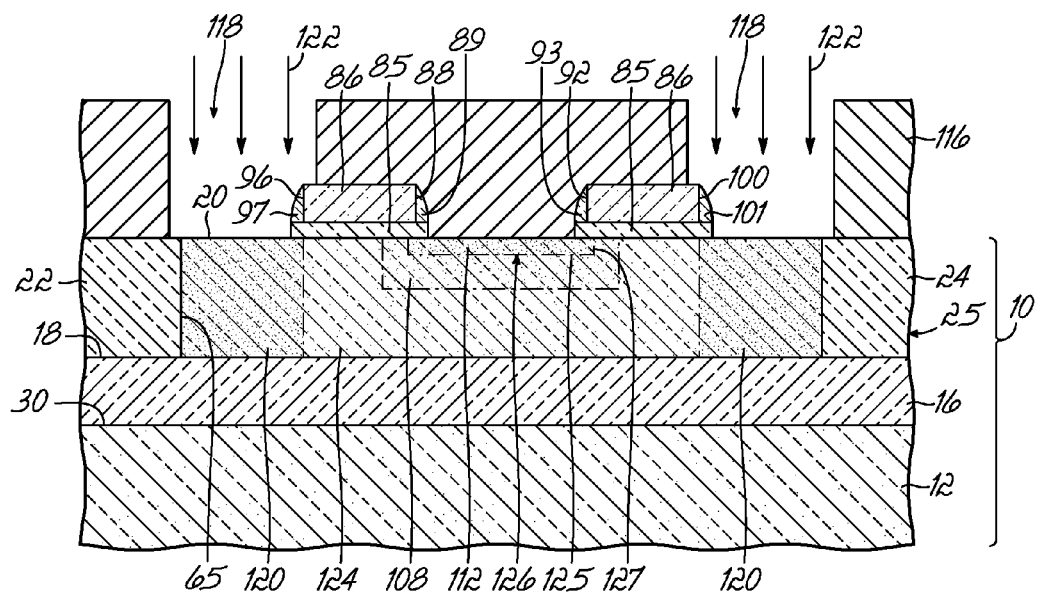

With reference to FIGS. 11 and 11A in which like reference numerals refer to like features in FIGS. 10, 10A and at a subsequent fabrication stage, mask 104 is stripped using, for example, plasma ashing or a chemical stripper. An implantation mask 116, which is similar in construction to mask 72 (FIGS. 6, 6A), is then formed that covers the top surface 20 of SOI layer 14 inside the sidewalls 88, 90, 92, 94 of the gate structure 87 and that partially overlaps with the gate structure 87. The mask 116 includes an opening or window 118 that partially exposes the top surface 20 of the SOI layer 14 between the inner periphery 65 of the isolation structure 25 and the dielectric spacers 97, 99, 101, 103 on gate structure 87.

A heavily-doped region 120, which is similar to heavily-doped region 76 (FIGS. 6, 6A), is defined in the SOI layer 14 using an ion implantation process that directs energetic ions 122 through the window 118 in mask 116 and implants the ions 122 in region 120. The impurity species constituting the ions 122 has the same conductivity type as the impurity species introduced by ions 32 (FIGS. 1, 1A) and ions 110 (FIGS. 9, 9A) into region 108.

Figure 12:
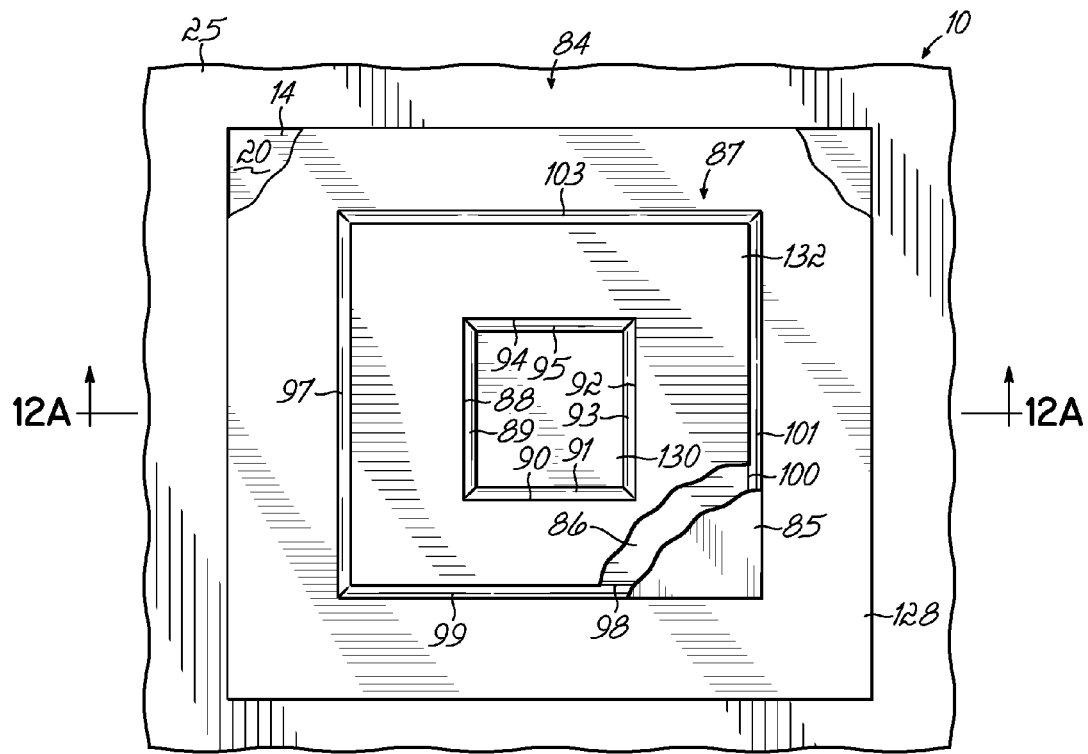
FIGS. 12 and 12A are diagrammatic top and cross-sectional views similar to FIGS. 11 and 11A, respectively, at a subsequent fabrication stage of the processing method.
Figure 12A:
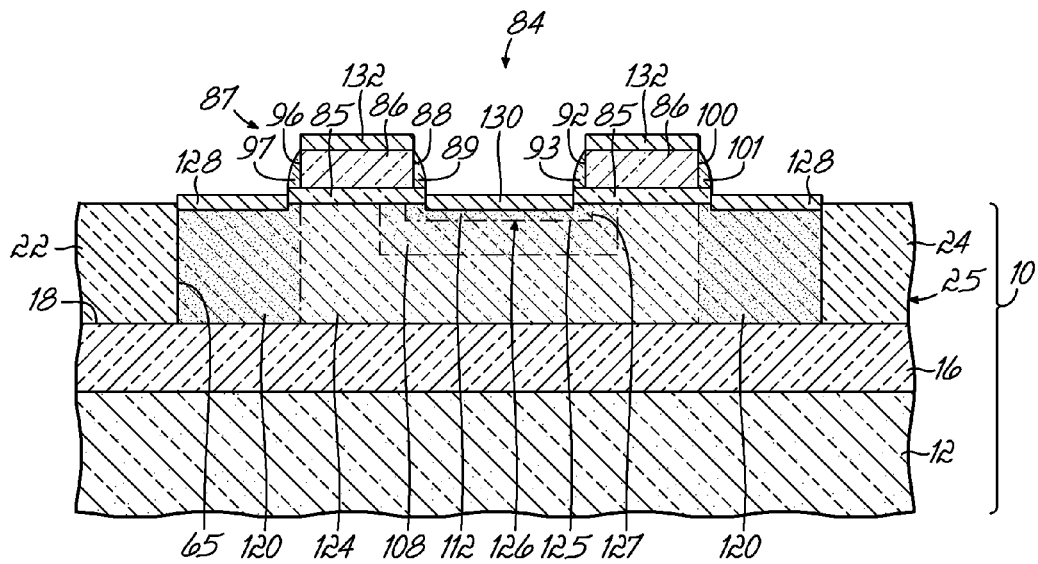

With reference to FIGS. 12 and 12A in which like reference numerals refer to like features in FIGS. 11, 11A and at a subsequent fabrication stage, silicide regions 128, 130, 132, which are similar to silicide regions 79, 81, 83 (FIGS. 7, 7A), are formed on doped regions 112, 120 and gate structure 87. The resulting device structure is a voltage-controlled hyper-abrupt junction varactor diode 84 that includes the gate structure 87, the doped region 112 as an anode, and the heavily-doped region 120, the moderately-doped region 108, and a lightly-doped region 124 beneath the gate structure 87 that operate as a graded cathode of opposite conductivity type to the anode. A control voltage applied to the gate structure 87 regulates carrier flow in the cathode through region 124 from the junction 126 to the contact supplied by the heavily-doped region 120, but typically junction diodes are two terminal devices used in reverse biased mode with simply an anode and cathode terminal as defined by regions 112 and 120, respectively.

During the fabrication process, the varactor diode 84 is replicated across at least a portion of the surface area of the SOI layer 14 of the SOI substrate 10. Standard processing follows, which includes formation of metallic contacts, metallization for the M1 level interconnect wiring, and interlayer dielectric layers, conductive vias, and metallization for upper level (M2-level, M3-level, etc.) interconnect wiring. Metallization in the contact level of the interconnect wiring establishes electrical connections with the gate structure 87 and independent electrical connections with the anode and cathode defined by doped regions of the SOI layer 14. As described above, field effect transistors (not shown) may be fabricated using CMOS techniques on other portions of the SOI layer 14 and at least some of the fabrication steps for the varactor diodes 84 may be shared with steps used to form the CMOS field effect transistors.

Figure 13:
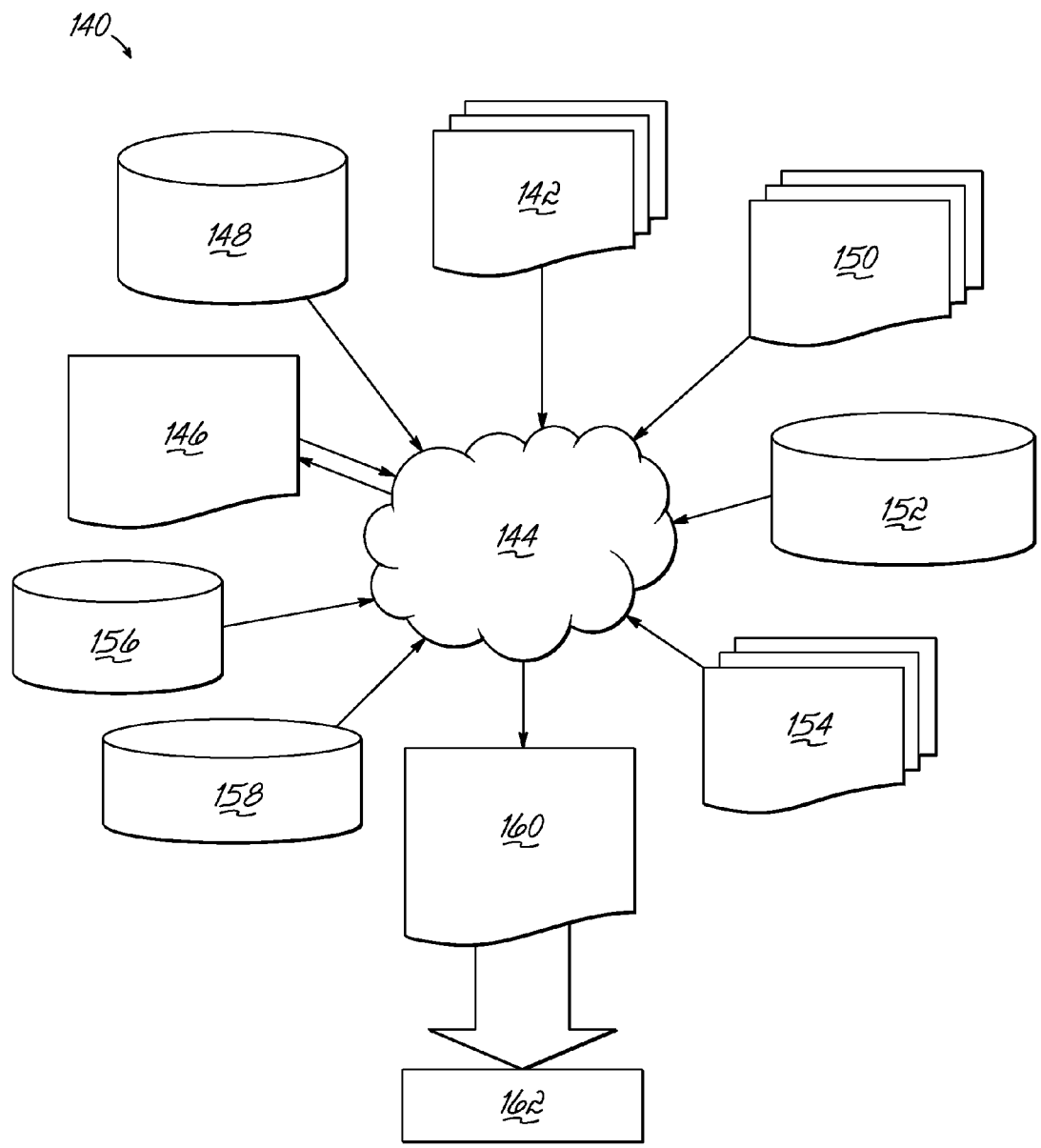
FIG. 13 is a flow diagram of a design process used in semiconductor design, manufacture, and/or test.

FIG. 13 shows a block diagram of an exemplary design flow 140 used for example, in semiconductor design, manufacturing, and/or test. Design flow 140 may vary depending on the type of integrated circuit (IC) being designed. For example, a design flow 140 for building an application specific IC (ASIC) may differ from a design flow 140 for designing a standard componentor from a design flow 140 for instantiating the design into a programmable array, for example a programmable gate array (PGA) or a field programmable gate array (FPGA) offered by Altera® Inc. or Xilinx® Inc. Design structure 142 is preferably an input to a design process 144 and may come from an IP provider, a core developer, or other design company or may be generated by the operator of the design flow, or from other sources. Design structure 142 comprises an embodiment of the invention as shown in FIGS. 7, 7A or in FIGS. 12, 12A in the form of schematics or HDL, a hardware-description language (e.g., Verilog, VHDL, C, etc.). Design structure 142 may be contained on one or more machine readable medium. For example, design structure 142 may be a text file or a graphical representation of an embodiment of the invention as shown in FIGS. 7, 7A or in FIGS. 12, 12A. Design process 144 preferably synthesizes (or translates) an embodiment of the invention as shown in FIGS. 7, 7A or in FIGS. 12, 12A into a netlist 146, where netlist 146 is, for example, a list of wires, transistors, logic gates, control circuits, I/O, models, etc. that describes the connections to other elements and circuits in an integrated circuit design and recorded on at least one of machine readable medium. For example, the medium may be a compact disk (CD), a compact flash, other flash memory, a packet of data to be sent via the Internet, or other networking suitable means. The synthesis may be an iterative process in which netlist 146 is resynthesized one or more times depending on design specifications and parameters for the circuit.

Design process 144 may include using a variety of inputs; for example, inputs from library elements 148 which may house a set of commonly used elements, circuits, and devices, including models, layouts, and symbolic representations, for a given manufacturing technology (e.g., different technology nodes, 32 nm, 45 nm, 90 nm, etc.), design specifications 150, characterization data 152, verification data 154, design rules 156, and test data files 158 (which may include test patterns and other testing information). Design process 144 may further include, for example, standard circuit design processes such as timing analysis, verification, design rule checking, place and route operations, etc. One of ordinary skill in the art of integrated circuit design can appreciate the extent of possible electronic design automation tools and applications used in design process 144 without deviating from the scope and spirit of the invention. The design structure of the invention is not limited to any specific design flow.

Design process 144 preferably translates an embodiment of the invention as shown in FIGS. 7, 7A or in FIGS. 12, 12A, along with any additional integrated circuit design or data (if applicable), into a second design structure 160. Design structure 160 resides on a storage medium in a data format used for the exchange of layout data of integrated circuits and/or symbolic data format (e.g., information stored in a GDSII (GDS2), GL1, OASIS, map files, or any other suitable format for storing such design structures). Design structure 160 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 7, 7A or in FIGS. 12, 12A. Design structure 160 may then proceed to a stage 162 where, for example, design structure 160 proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being on or "over" another element, it can be directly on or over the other element or intervening elements may also be present. In contrast, when an element is described as being "directly on" or "directly over" another element, there are no intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present.

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

The invention claimed is:

1. A method of fabricating a device structure using a device layer of an SOI substrate, the method comprising:
    forming a gate structure carried on a top surface of the device layer;
    applying a first mask with a window that exposes a portion of the top surface adjacent to at least one sidewall of the gate structure;
    implanting ions of a first conductivity type through the window in the first mask and into the device layer using at least one sidewall of the gate structure as a second mask to define a first doped region adjacent to the gate structure; and
    implanting ions of a second conductivity type through the window in the first mask and into the device layer to form a p-n junction in the first doped region such that a first segment of the p-n junction is aligned substantially parallel to the top surface of the device layer and a second segment of the p-n junction extends from the first segment toward the top surface of the device layer,
    wherein the ions of the first conductivity type are implanted at a first incident angle relative to a surface normal of the top surface and the ions of the second conductivity type are implanted at a second incident angle relative to the surface normal of the top surface.

2. The method of claim 1 wherein implanting the ions of the second conductivity type further comprises:
    selecting an impurity species, an ion kinetic energy, and the second incident angle such that a projected range of the ions of the second conductivity type in the device layer is shorter than a projected range of the ions of the first conductivity type in the device layer.

3. The method of claim 1 wherein the second incident angle is approximately equal to the first incident angle.

4. The method of claim 1 further comprising:
    rotating the SOI substrate about the surface normal to at least two different angular orientations when the ions of the first conductivity type and the ions of the second conductivity type are implanted.

5. The method of claim 1 wherein the gate structure is a dummy gate structure, and further comprising:
    forming a gate dielectric layer on the top surface of the device layer; and forming a gate conductor layer on the top surface of the gate dielectric layer to define a gate stack.

6. The method of claim 1 wherein forming the gate structure further comprises:

forming a gate dielectric layer on the top surface of the device layer; and forming a gate conductor layer on the top surface of the gate dielectric layer to define a gate stack.

7. The method of claim 1 wherein the first doped region has a first conductivity type, the gate structure includes another sidewall separated from the at least one sidewall by a width of the gate structure, and further comprising:

doping a second region of the device layer adjacent to the another sidewall of the gate structure to have the first conductivity type.

8. The method of claim 7 further comprising:

doping a third region of the device layer beneath the gate structure to have the first conductivity type before forming the gate structure on the top surface of the device layer and doping the second region of the device layer.

9. The method of claim 8 wherein the third doped region has a lower doping concentration than the first doped region, and the second doped region has a higher doping concentration than the third doped region.

10. The method of claim 1 wherein the gate structure is shaped to have an outer periphery and an inner periphery that includes the at least one sidewall.

11. The method of claim 1 wherein the device structure is a voltage-controlled varactor diode.

* * * * *